(12) United States Patent
Shen et al.

(10) Patent No.: US 8,729,634 B2
(45) Date of Patent: May 20, 2014

(54) FINFET WITH HIGH MOBILITY AND STRAIN CHANNEL

(75) Inventors: Chun-Liang Shen, New Taipei (TW);
Kuo-Ching Tsai, Hsin-Chu (TW);
Hou-Ju Li, Hsin-Chu (TW);
Chun-Sheng Liang, Changhua County (TW); Kao-Ting Lai, Hsin-Chu (TW);
Kuo-Chiang Ting, Hsinchu (TW);
Chi-Hsi Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/525,050

(22) Filed: Jun. 15, 2012

(65) Prior Publication Data

US 2013/0334606 A1   Dec. 19, 2013

(51) Int. Cl.
*H01L 21/762* (2006.01)
*H01L 29/06* (2006.01)

(52) U.S. Cl.
USPC .................... 257/368; 438/294; 257/E21.014

(58) Field of Classification Search
USPC .................. 257/308, 722, E21.014, 288, 368;
438/294
See application file for complete search history.

(56) References Cited

U.S. PATENT DOCUMENTS

| | | | |
|---|---|---|---|
| 8,242,568 B2 * | 8/2012 | Ikeda et al. | 257/401 |
| 2011/0068407 A1 * | 3/2011 | Yeh et al. | 257/369 |

FOREIGN PATENT DOCUMENTS

| | | |
|---|---|---|
| JP | 2006-516821 | 7/2006 |
| KR | 10-2006-0130704 | 12/2006 |
| WO | 2004068585 | 8/2004 |
| WO | 2005098963 | 10/2005 |

OTHER PUBLICATIONS

Liu, C. W., et al., "Mobility-Enhancement Technologies," IEEE Circuits & Devices Magazine, May/Jun. 2005, pp. 21-36.
Oh, J., et al., "Mechanisms for Low On-State Current of Ge (SiGe) nMOSFETs: A Comparative Study on Gate Stack, Resistance, and Orientation-Dependent Effective Masses," 2009 Symposium on VLSI Technology Digest of Technical Papers, pp. 238-239.
Wikipedia, "Multigate device," http://en.wikipedia.org/wiki/Multigate_device, Jun. 13, 2012, 6 pages.
Wikipedia, "Nanowire," http://en.wikipedia.org/wiki/Nanowire, Jun. 3, 2012, 7 pages.
Shen et al., Office Action for corresponding Korean Patent Application No. 10-2012-0093700, 8 pages (including translation), Aug. 27, 2013.

* cited by examiner

*Primary Examiner* — Matthew W. Such
*Assistant Examiner* — Monica D Harrison
(74) *Attorney, Agent, or Firm* — Slater & Matsil, L.L.P.

(57) ABSTRACT

An integrated circuit device includes a fin at least partially embedded in a shallow trench isolation (STI) region and extending between a source and a drain. The fin is formed from a first semiconductor material and having a trimmed portion between first and second end portions. A cap layer, which is formed from a second semiconductor material, is disposed over the trimmed portion of the fin to form a high mobility channel. A gate electrode structure is formed over the high mobility channel and between the first and second end portions.

20 Claims, 13 Drawing Sheets

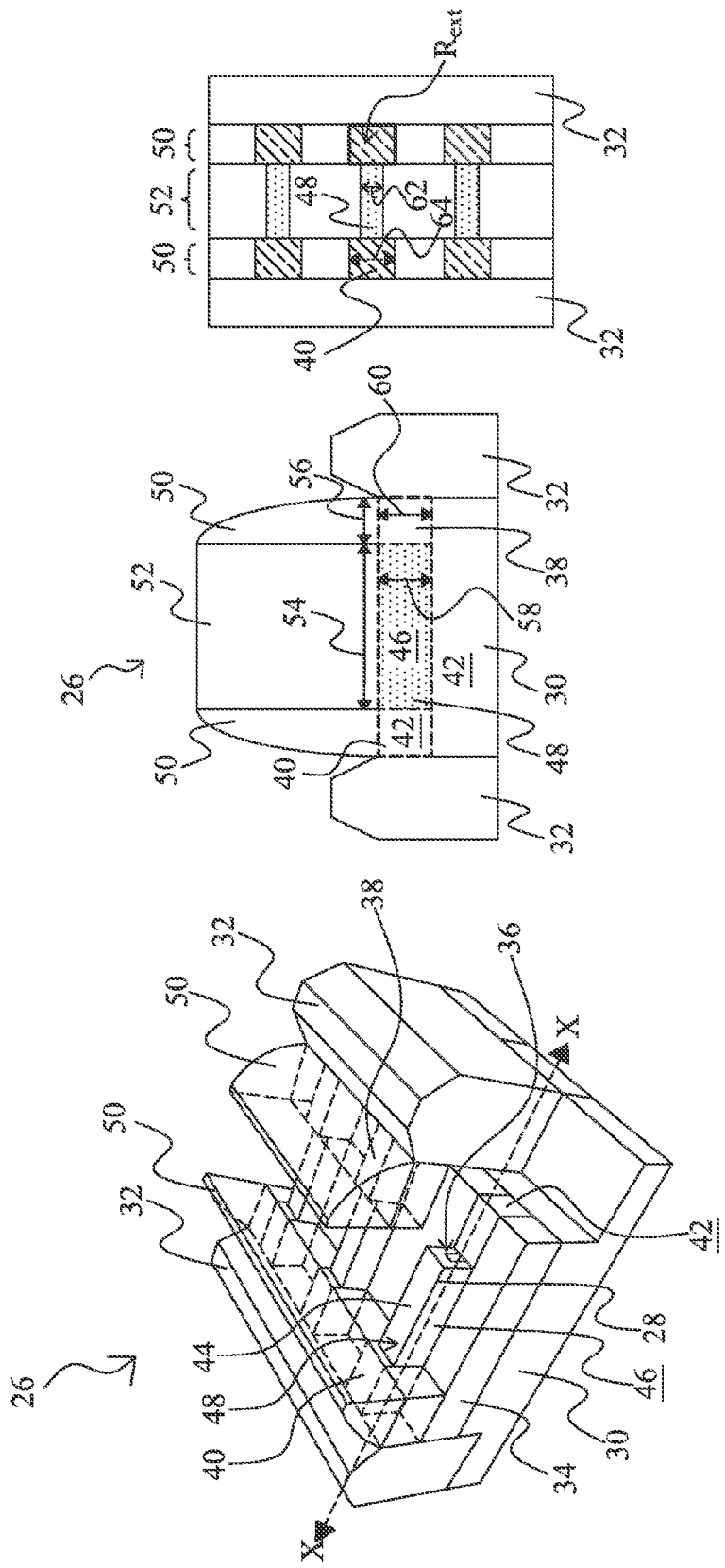

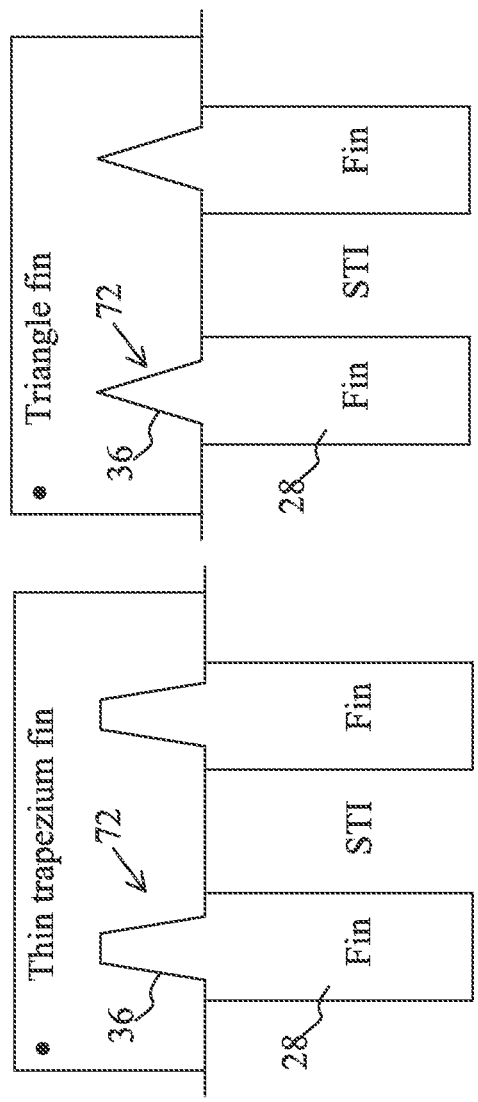

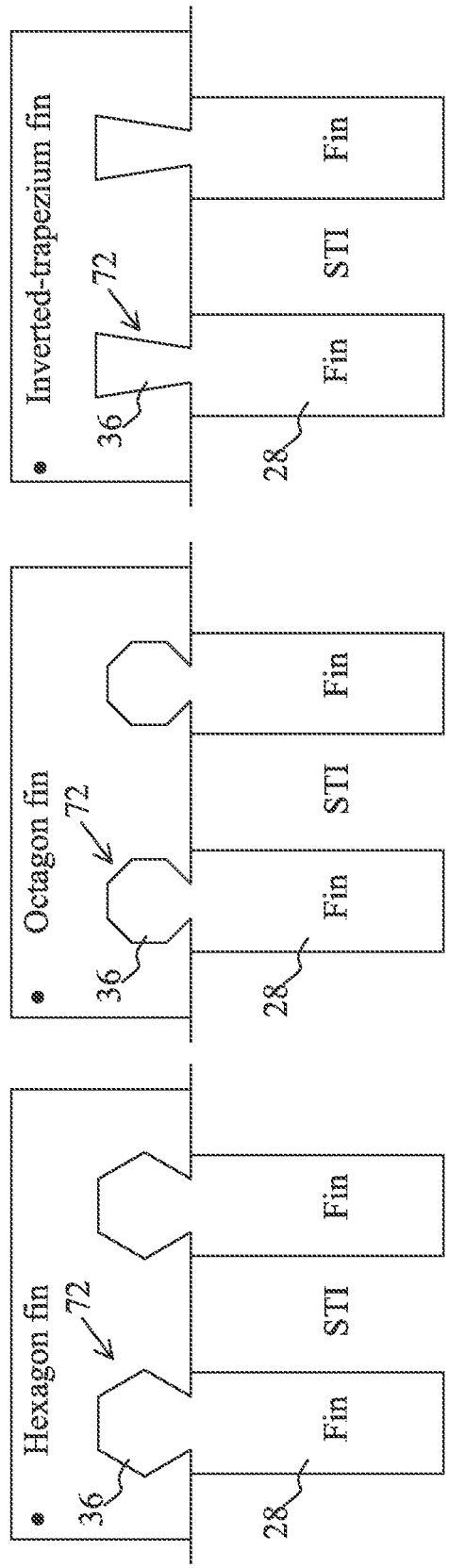

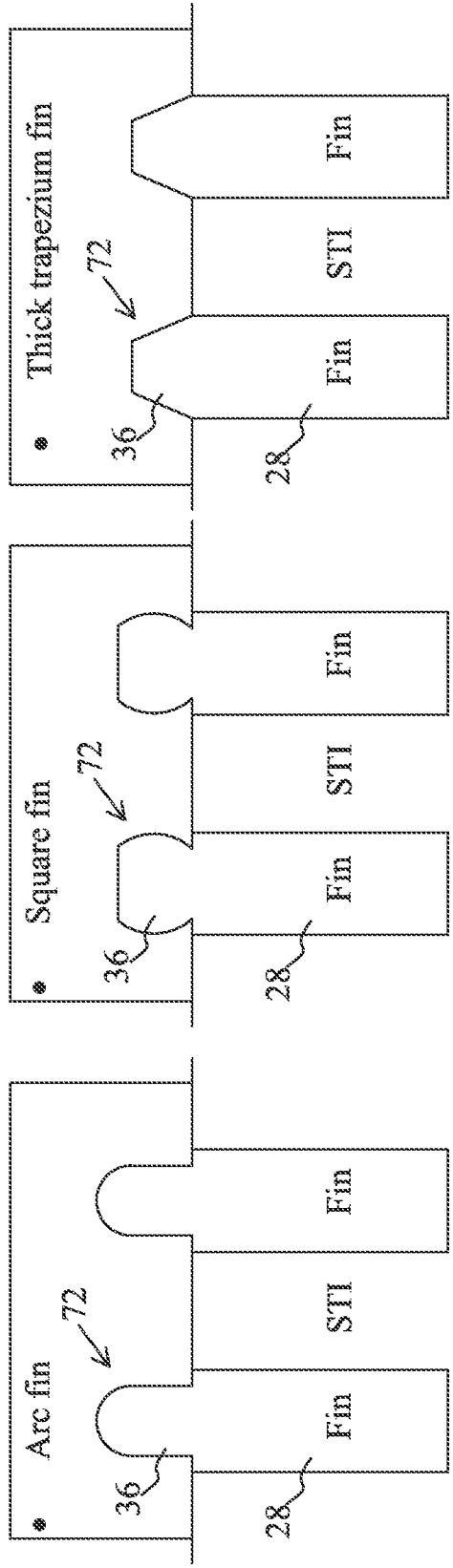

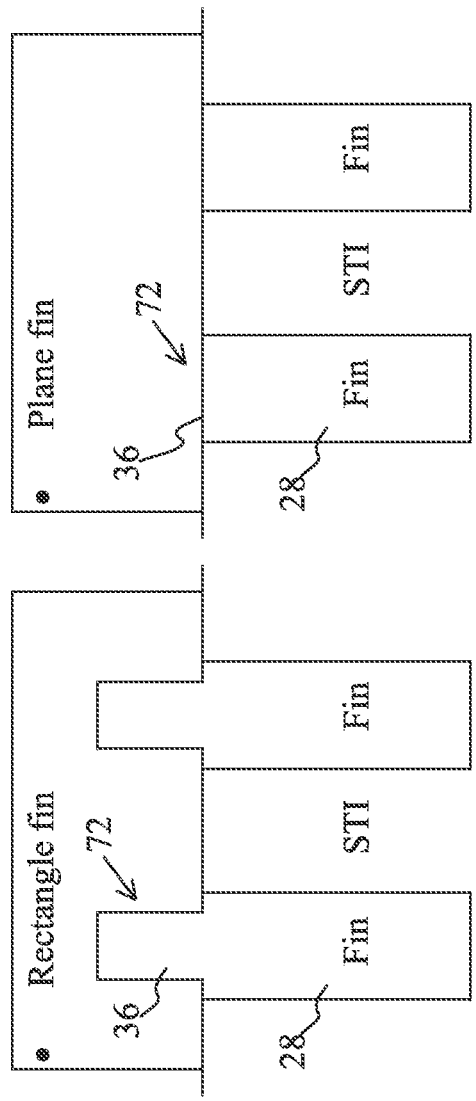

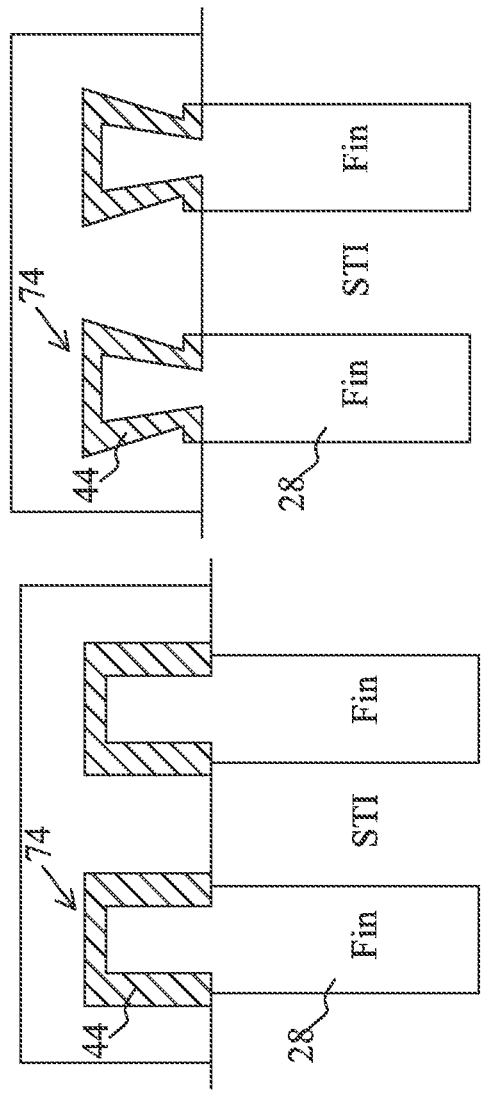

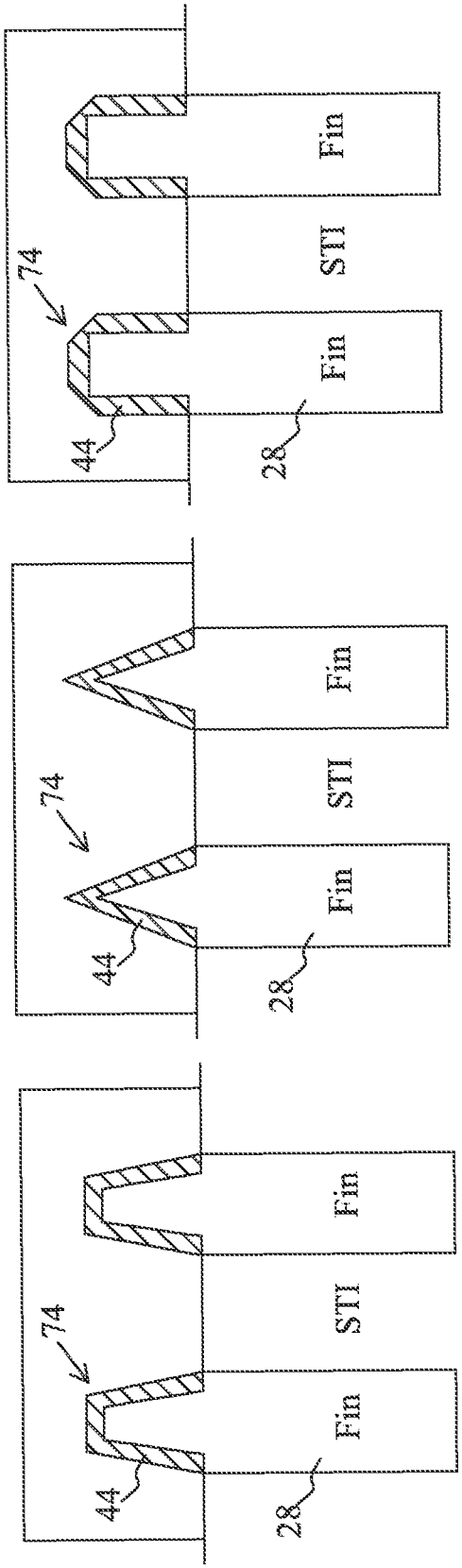

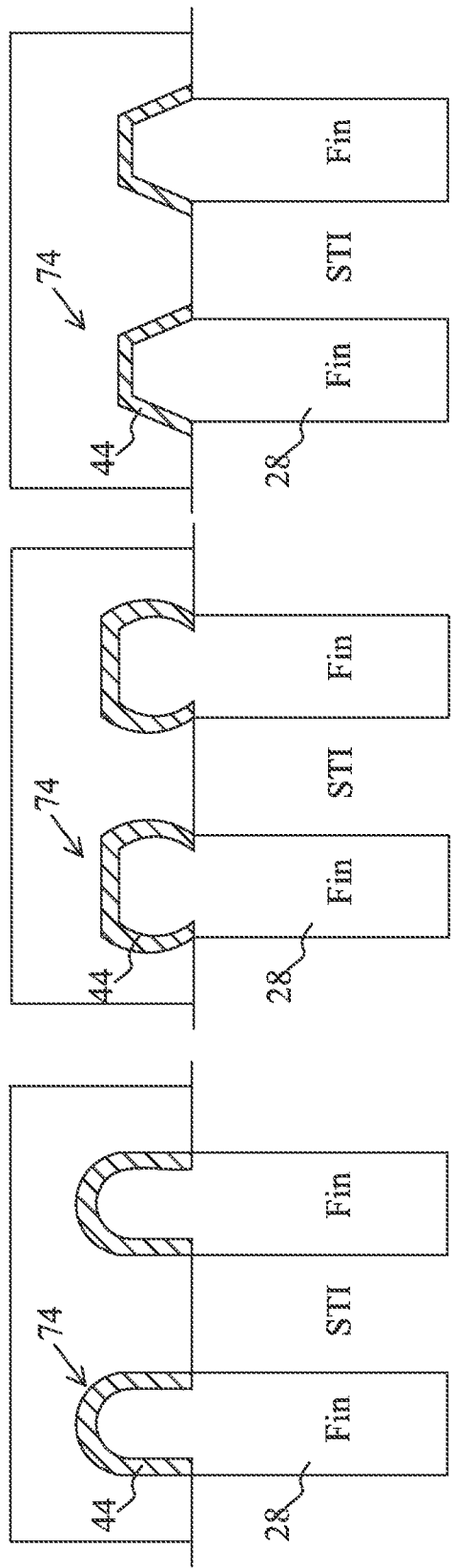

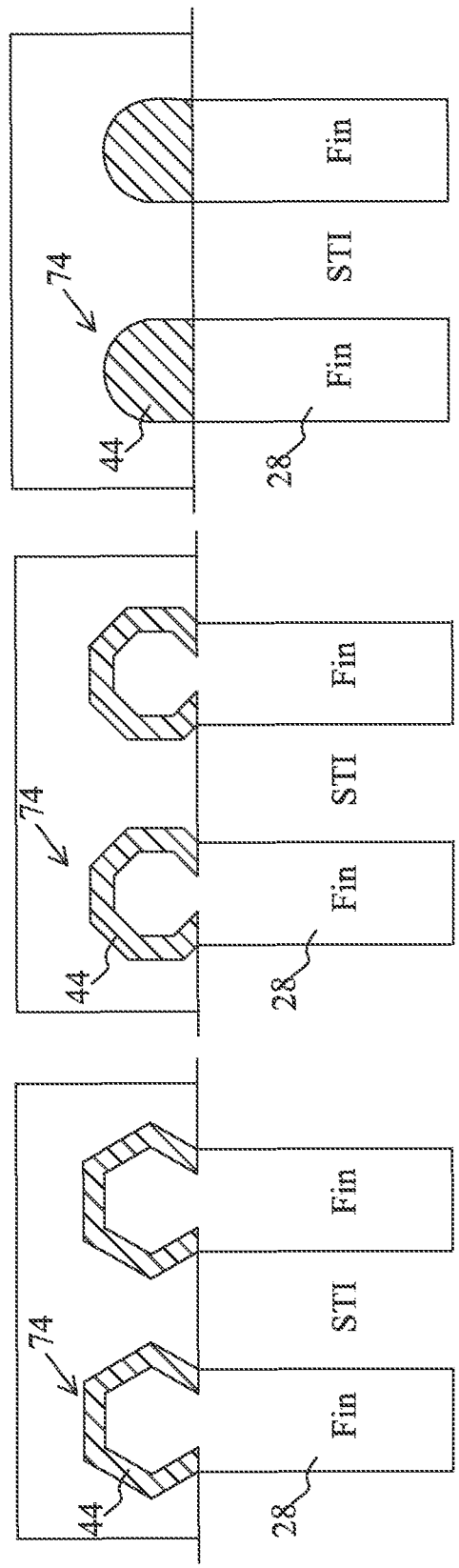

FINFET WITH HIGH MOBILITY AND STRAIN CHANNEL

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in sub 32 nm transistor nodes. For example, FinFETs not only improve areal density but also improve gate control of the channel.

While conventional FinFET devices may provide a mobility and/or strain channel, the process by which the channel is formed in such FinFET devices may lead to undesirable results. For example, a source/drain selective epitaxial growth process or an activation anneal process may have a detrimental thermal impact on the channel of a FinFET device. Indeed, the material properties of the channel may change and the strain provided by the channel may be decayed or relaxed.

In addition, the mismatch between the material of the channel and surrounding material (e.g., silicon) may lead to the generation of point or plane crystal defects, especially when the materials are subjected to thermal processes.

BRIEF DESCRIPTION OF THE DRAWINGS

For a more complete understanding of the present disclosure, and the advantages thereof, reference is now made to the following descriptions taken in conjunction with the accompanying drawing, in which:

FIG. 3 is a perspective view of an embodiment FinFET device having portions cut away for the purpose of illustration;

FIG. 4 is a cross section of the FinFET device of FIG. 3 taken generally along line x-x;

FIG. 5 is a plan view of the FinFET device of FIG. 3;

FIGS. 11-20 are cross section views of embodiment profiles of a trimmed fin from the FinFET device of FIG. 3 taken generally along line y-y in FIG. 8; and FIGS. 21-31 are cross section views of embodiment profiles of a mobility channel from the FinFET device of FIG. 3 taken generally along line y-y in FIG. 9.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a FinFET metal oxide semiconductor (MOS). The concept may also be applied, however, to other integrated circuits and electronic structures including, but not limited to, multiple gate field-effect transistor (MuGFET) and nanowire devices.

Figures 1, 2:
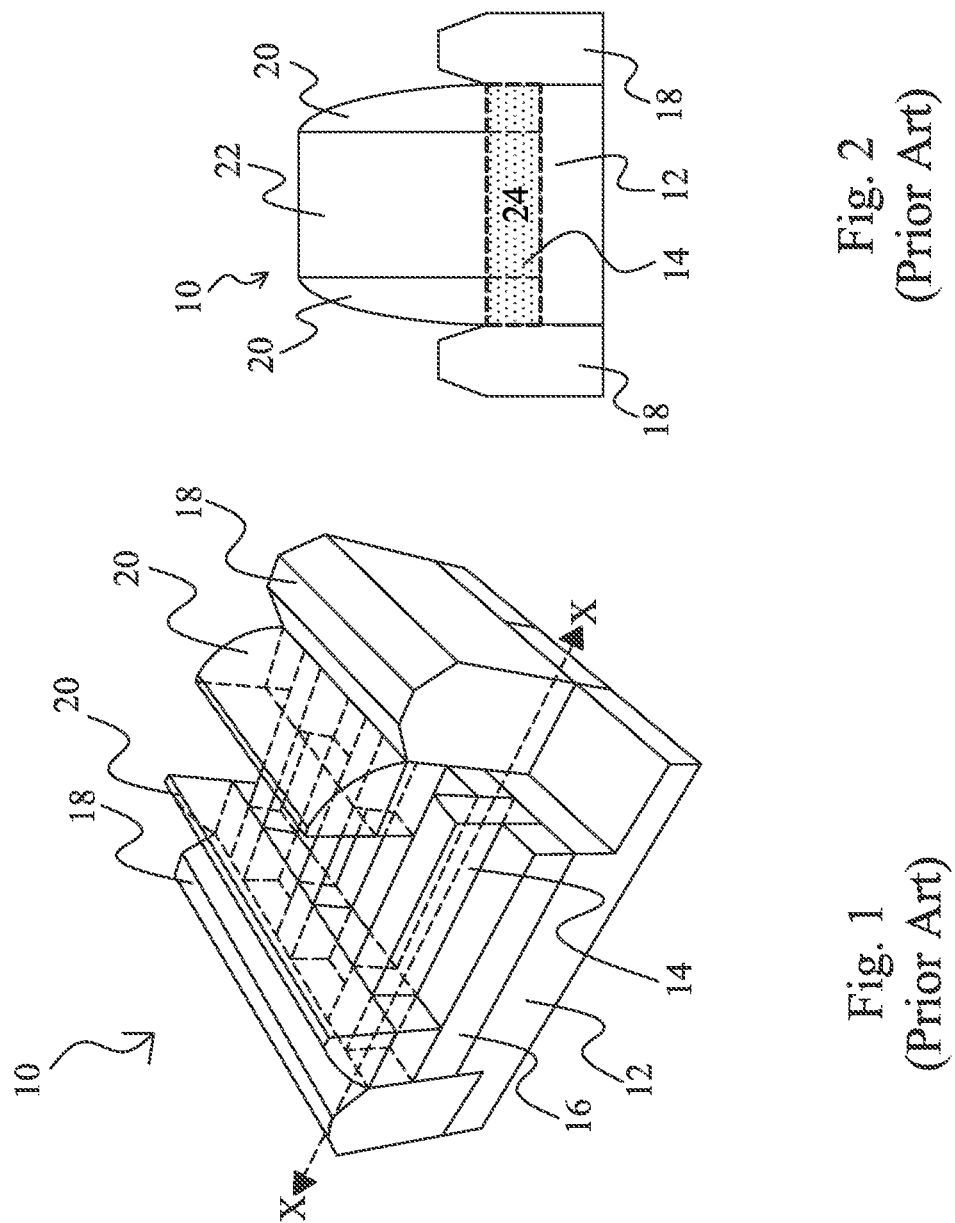
FIG. 1 is a perspective view of a prior art FinFET device having portions cut away for the purpose of illustration.
FIG. 2 is a cross section of the prior art FinFET device of FIG. 1 taken generally along line x-x.

FIGS. 1-2 represent a prior art FinFET device 10, which will be briefly described. The FinFET device 10 includes a substrate 12 supporting several fins 14, which are at least partially embedded in shallow trench isolation (STI) regions 16. The fins 14 generally extend between source and drain regions 18 on opposing ends of the FinFET device 10. Spacers 20, which are stacked upon a portion of the fins 14 adjacent the source drain regions 18, are disposed on opposing sides of a gate electrode structure 22 depicted in FIG. 2.

While not shown for ease of illustration, the gate electrode structure 22 of FIGS. 1 and 2 may include several discrete layers or components such as, for example, an interfacial oxide layer, a high-k-dielectric layer, and a metal gate layer. In FIGS. 1-2, the substrate 12 is formed from silicon while the fins 14 are formed from silicon germanium. In an embodiment, the fins 14 have a germanium dosage concentration in a range of about 10% to about 100%.

As shown in FIG. 2, the portion of the fin 14 directly beneath the spacers 20 (and adjacent the source and drain regions 18) and the portion of the fin 14 directly beneath the gate electrode structure 22 are formed from the same material and collectively form a mobility channel 24. Unfortunately, when these portions are both formed from the same semiconductor material (e.g., silicon germanium), the mobility channel 24 may undesirably degrade with n-type FET activation, which leads to higher source/drain resistance. In addition, use of the same material for the entire mobility channel 24 generates a high thermal budget, which leads to elevated interface trap density ($D_{it}$). Other adverse results may also be realized.

Referring now to FIG. 3, an embodiment FinFET device 26 is illustrated. As will be more fully explained below, the FinFET device 26 may be formed using a simple replacement gate process, uses different semiconductor materials under the spacers and the gate electrode structure to reduce channel volume and induce low source/drain resistance, and provides a lower thermal budget and higher channel dose concentration.

As illustrated in FIGS. 3-4, the FinFET device 26 includes one or more fins 28 supported by an underlying substrate 30, which substrate may be suitably formed silicon or other semiconductor material. Each fin 28 extends between a source and a drain region 32. In an embodiment, each fin 28 is at least partially embedded in an STI region 34. In another embodiment, the fins 28 may terminate below or be flush with a top surface of the STI region 34.

Each fin 28 includes a trimmed portion 36 disposed between a first end portion 38 and a second end portion 40 on opposing sides of each of the fins 28. As will be more fully explained below, the trimmed portion 36 generally has a reduced profile relative to the first and second end portions 38, 40. The trimmed portion 36 and the first and second end portions 38, 40 are formed from a first semiconductor material 42. In an embodiment, the first semiconductor material 42 is silicon.

In an embodiment, the trimmed portion 36 is covered by a cap layer 44 (a.k.a., a strain film). In an embodiment, the cap layer 44 is about 0.1 nm (1 A) to about 50 µm thick. The cap layer 44 is formed from a second semiconductor material 46, which is different from the first semiconductor material 42, to form a high mobility channel 48. In an embodiment, the second semiconductor material 46 is silicon germanium, germanium, or an III-V semiconductor alloy. The high mobility channel 48 is configured to generate either tension or compression in the fin 28.

In an embodiment, a spacer 50 is formed over the first end portion 38 and the second end portion 40 of each fin 28. As shown, the spacers 50 are generally adjacent to the source and drain regions 32 and disposed on opposing sides of a gate electrode structure 52 as shown in FIG. 4. While illustrated as a single component in FIG. 4, the gate electrode structure 52 may include, for example, an interfacial oxide layer, a high-k dielectric layer, and a metal gate.

As shown in FIG. 4, in an embodiment a width 54 of high mobility channel 48 (and the underlying trimmed portion 36 of the fin 28) is less than about 5 µm. In addition, in an embodiment a width 56 of the first and second end portions 38, 40 is less than about 5 µm. Still referring to FIG. 4, in an embodiment a height 58 of the high mobility channel 48 is less than about 1 µm. In addition, in an embodiment a height 60 of the first and second end portions 38, 40 is less than about 1 µm. In an embodiment, the width 54 and/or the height 58 of the high mobility channel 48 may be less than that of the first and second end portions 38, 40.

Referring now to FIG. 5, in an embodiment a thickness 62 of the high mobility channel 48 of the fin 28 is less than a thickness 64 of the first and second end portions 38, 40. By increasing the thickness 64 of the first and second end portions 38, 40 relative to the thickness 62 of the high mobility channel 48, the parasitic resistance of the first and second end portions 38, 40 is lowered. For further parasitic resistance reduction, in an embodiment the source and drain regions 32 are enlarged to merge each of the fins 28 as shown in FIG. 5. In such embodiments the source and drain regions 32 may be formed by an epitaxy process.

Figure 6:
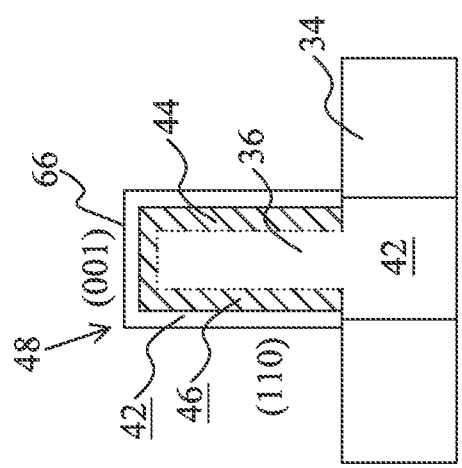
FIG. 6 is a cross section view of a second cap layer used to form the high mobility channel in an embodiment FinFET device similar to the FinFET device of FIG. 3

As depicted in FIG. 6, in an embodiment a second cap layer 66 may be formed over the cap layer 44 in order to form the high mobility channel 48. In an embodiment, the second cap layer 66 is formed from the first semiconductor material 42. In an embodiment, the second cap layer 66 is formed from silicon. In an embodiment, the second cap layer 66 is about 0.1 nm (1 A) to about 50 µm thick. In an embodiment, different portions of the second cap layer 66 may have different crystal structures. For example, the crystal structure of a top portion of the second cap layer may be <001>and the crystal structure of sidewalls of the second cap layer 66 may be <110>. In other embodiments, different crystal structures may be employed for the second cap layer 66. In an embodiment, the high mobility channel 48 has a <110>crystal structure and provides a compressive strain that improves the channel mobility.

Figure 7:
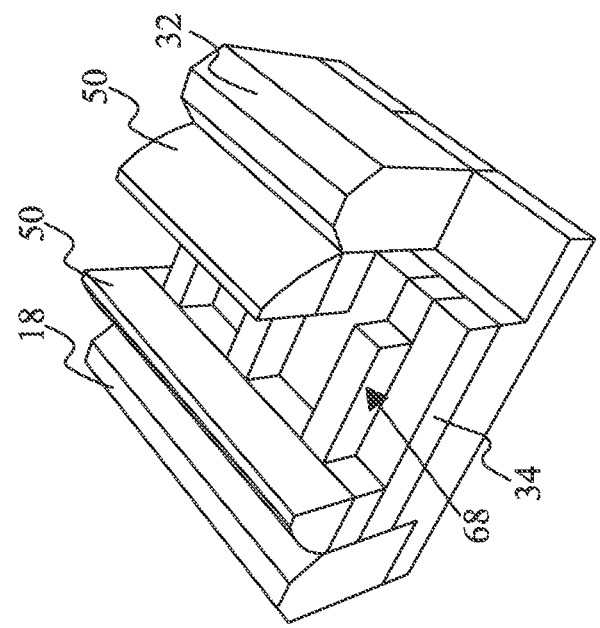
FIG. 7 is a perspective view of a replacement gate process used in an embodiment method of forming the FinFET of FIG. 3.

Referring collectively to FIGS. 7-10, an embodiment method of forming the FinFET device 26 of FIG. 3 is depicted. In FIG. 7, a partially formed integrated circuit device is shown. Notably, a portion of the partially formed integrated circuit device has been removed for ease of illustration. To begin, one or more conventional fins 68 are formed using known methods. Thereafter, a gate dielectric (not shown) is deposited on the fins 68. Next, a replacement gate (RPG) process is performed. During the RPG process, a protective material 70 (e.g., a protective oxide or a polysilicon) is formed over the fins 68 and the STI regions 16 between the spacers 50. With the fins 28 protected as shown in FIG. 7, the source and drain regions 32 are formed. In an embodiment, the source and drain regions 32 are formed using a selective epitaxial growth (SEG) process below about 600° C. In an embodiment, an anneal process below about 600° C. is also performed.

Figure 8:
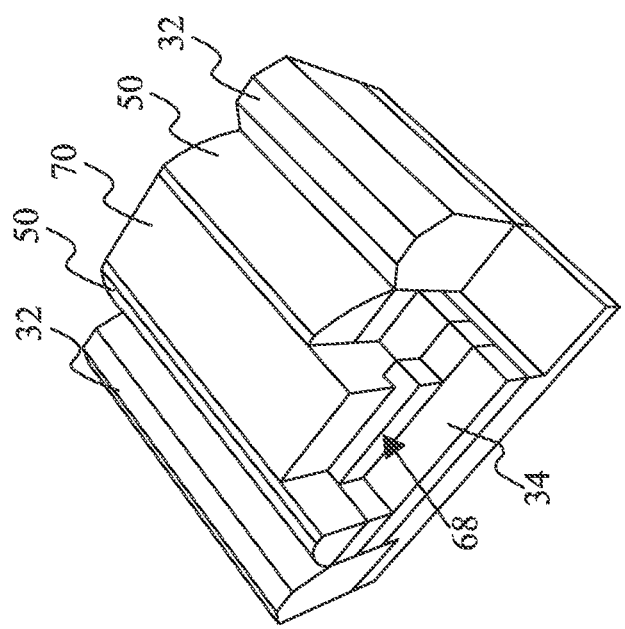
FIG. 8 is a perspective view of a protective oxide removal process in an embodiment method of forming the FinFET of FIG. 3.

After the source and drain regions 32 are formed, the protective material 70 and the gate dielectric are removed as shown in FIG. 8. Removal of the protective oxide 70 and the gate dielectric leaves a central portion of the fins 68 uncovered. In other words, a portion of the fins 68 inward of the spacers 50 is now exposed. As previously noted above, the fins 68 are formed from the first semiconductor material 42, which in this example is silicon.

Figure 9:
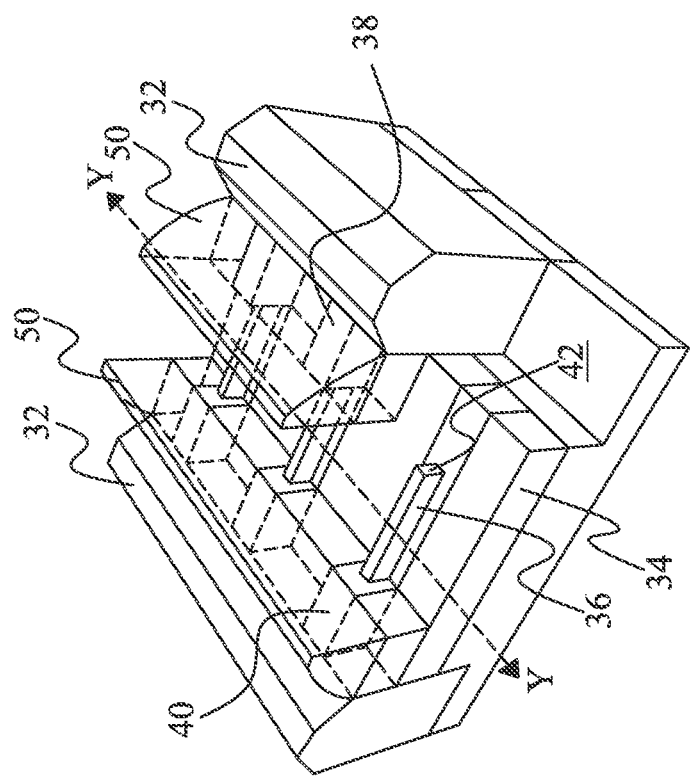
FIG. 9 is a perspective view of a trimming process in an embodiment method of forming the FinFET of FIG. 3.

Next, as shown in FIG. 9, a portion of each of the fins 68 between the first and second end portions 38, 40 is trimmed to form a trimmed portion 36 of the fin. In an embodiment, a fin trim process may be used to form the trimmed portion 36. In an embodiment, an optional re-shaping process may be performed, depending on, for example, a device optimization desired.

Figure 10:
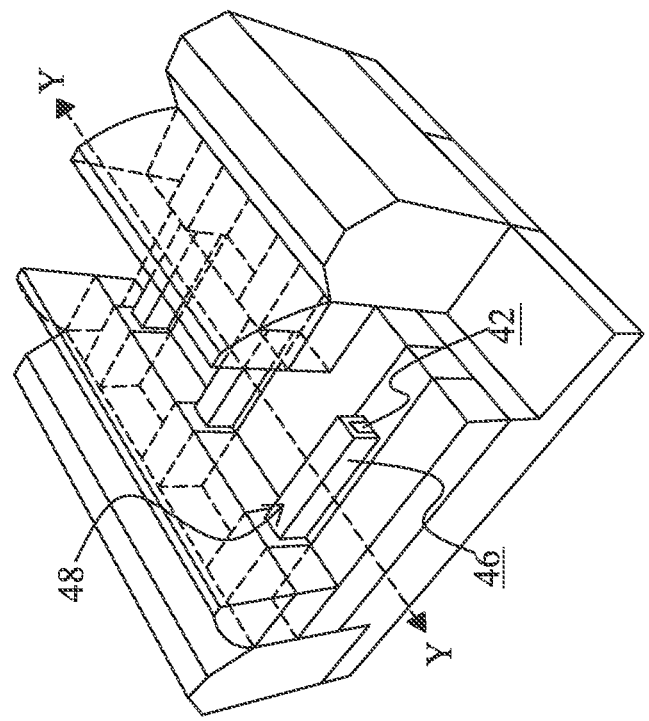
FIG. 10 is a perspective view of a cap layer used to form a high mobility channel in the FinFET of FIG. 3.

After the fins 28 have been desirably shaped, the trimmed portion 36 may be capped or covered with the second semiconductor material 46 as shown in FIG. 10. When the trimmed portion 36 is capped with cap layer 44 and/or second cap layer 66 (FIG. 6), a high mobility channel 48 is formed in the fin 28. In an embodiment, and as previously noted above, the cap layer 44 may be formed from silicon germanium, germanium, or an III-V semiconductor alloy. In an embodiment, the second cap layer 66 (FIG. 6), which is formed over the cap layer 44, may be formed from silicon.

After the high mobility channel 48 formed as illustrated in FIG. 10 or in FIG. 6, a gate electrode structure 52 (FIG. 4) is formed. As previously noted, the gate electrode structure 52 may include an interfacial oxide layer, a dielectric layer, and a metal gate layer. The gate electrode structure 52 is formed over the high mobility channel 48 and the STI regions 34. The gate electrode structure 52 is also formed between the first and second end portions 38, 40 of each of the fins 28 and inward of the spacers 50.

Referring collectively to FIGS. 11-20, in various embodiments the trimmed portion 36 of the fin 28 may have, for example, a square, rectangle, trapezium, triangle, hexagon, octagon, inverted-trapezium, arc, and plane fin trim profile 72. In other embodiments, the trimmed portion 36 of the fin 28 may also be formed with other trim profiles 72. In addition, as collectively illustrated in FIGS. 21-31, the high mobility channel 48 may have, for example, a square, rectangle, trapezium, triangle, partial hexagon, hexagon, octagon, inverted-trapezium, and arc channel profile 74. In other embodiments, the high mobility channel 48 may also be formed with other trim profiles 74.

The FinFET device 26 or other integrated circuit device formed as noted above has several beneficial and desirable features. For example, the FinFET device 26 is formed using the RPG process, which is relatively simple to perform. In addition, the FinFET device 26 provides a germanium-free channel under the spacers 50 and has a reduced channel volume to induce low resistance. Further, the FinFET device 26 has a lower thermal budget and enables a higher channel dose concentration.

In an embodiment, an integrated circuit device includes a fin extending between a source and a drain. The fin has a trimmed portion between first and second end portions and is covered by a cap layer. The trimmed portion and the first and second end portions are formed from a first semiconductor material. The cap layer is formed from a second semiconductor material different than the first semiconductor material to form a high mobility channel. A gate electrode structure is formed over the high mobility channel between the first and second end portions.

In an embodiment, an integrated circuit device includes a fin extending between a source and a drain. The fin has a trimmed portion between first and second end portions and is covered by first and second cap layers. The trimmed portion, the first and second end portions, and the second cap layer are formed from a first semiconductor material. The first cap layer is formed from a second semiconductor material different than the first semiconductor material to form a high mobility channel. A gate electrode structure is formed over the high mobility channel inward of the first and second end portions.

In an embodiment, a method of forming a FinFET is provided. A fin is formed from a first semiconductor material. The fin is disposed between a source and a drain and at least partially embedded in a shallow trench isolation (STI) region. A portion of the fin between first and second end portions is trimmed to form a trimmed portion. The trimmed portion is capped with a second semiconductor material to form a high mobility channel. A gate electrode structure is formed over the high mobility channel and between the first and second end portions.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit device, comprising:
   a fin extending between a source and a drain, the fin having a trimmed portion between first and second end portions, the trimmed portion having a reduced profile relative to the first and second end portions and covered by a cap layer, the trimmed portion and the first and second end portions formed from a first semiconductor material, the cap layer formed from a second semiconductor material different than the first semiconductor material to form a high mobility channel; and
   a gate electrode structure formed over the high mobility channel between the first and second end portions.

2. The integrated circuit device of claim 1, wherein the first semiconductor material is silicon and the second semiconductor material is silicon germanium.

3. The integrated circuit device of claim 1, wherein the second semiconductor material is one of silicon germanium, germanium, and an III-V semiconductor alloy.

4. The integrated circuit device of claim 1, wherein the high mobility channel includes a second cap layer disposed over the cap layer, the second cap layer formed from the first semiconductor material.

5. The integrated circuit device of claim 1, wherein the high mobility channel is configured to generate one of tension and compression in the fin.

6. The integrated circuit device of claim 1, wherein a thickness of the high mobility channel is less than a thickness of at least one of the first end portion and the second end portion of the fin.

7. The integrated circuit device of claim 1, wherein the trimmed portion of the fin has one of a square, rectangle, trapezium, triangle, hexagon, octagon, inverted-trapezium, arc, and plane fin trim profile.

8. The integrated circuit device of claim 1, wherein the high mobility channel has one of a square, rectangle, trapezium, triangle, partial hexagon, hexagon, octagon, inverted-trapezium, and arc channel profile.

9. The integrated circuit device of claim 1, wherein the fin is at least partially embedded in a shallow trench isolation (STI) region.

10. An integrated circuit device, comprising:
    a fin extending between a source and a drain, the fin having a trimmed portion between first and second end portions, the trimmed portion having a reduced profile relative to the first and second end portions and covered by first and second cap layers, the trimmed portion, the first and second end portions, and the second cap layer formed from a first semiconductor material, the first cap layer formed from a second semiconductor material different than the first semiconductor material to form a high mobility channel; and
    a gate electrode structure formed over the high mobility channel inward of the first and second end portions.

11. The integrated circuit device of claim 10, wherein the first semiconductor material is silicon and the second semiconductor material is one of silicon germanium, germanium, and an III-V semiconductor alloy.

12. The integrated circuit device of claim 10, wherein the high mobility channel is configured to generate one of tension and compression in the fin.

13. The integrated circuit device of claim 10, wherein a thickness of the high mobility channel is less than a thickness of at least one of the first end portion and the second end portion of the fin.

14. The integrated circuit device of claim 10, wherein the trimmed portion of the fin has one of a square, rectangle, trapezium, triangle, hexagon, octagon, inverted-trapezium, arc, and plane fin trim profile.

15. The integrated circuit device of claim 10, wherein the high mobility channel has one of a square, rectangle, trapezium, triangle, partial hexagon, hexagon, octagon, inverted-trapezium, and arc channel profile.

16. The integrated circuit device of claim 10, wherein a first spacer is disposed adjacent to the source and over the first end portion of the fin, and a second spacer is disposed adjacent to the drain and over the second end portion of the fin.

17. The integrated circuit device of claim 10, wherein the fin is at least partially embedded in a shallow trench isolation (STI) region.

18. A method of forming a fin field effect transistor (FinFET) device, comprising:
    forming a fin from a first semiconductor material, the fin disposed between a source and a drain and at least partially embedded in a shallow trench isolation (STI) region;

trimming a portion of the fin between first and second end portions to form a trimmed portion such that the portion trimmed has a reduced profile relative to the first and second end portions;

capping the trimmed portion with a second semiconductor material to form a high mobility channel; and forming a gate electrode structure over the high mobility channel and between the first and second end portions.

19. The method of claim 18, further comprising capping the second semiconductor material with the first semiconductor material to form the high mobility channel.

20. The method of claim 18, further comprising generating at least one of tension and compression in the fin with the high mobility channel.

* * * * *